United States Patent
Kim et al.

(10) Patent No.: US 12,364,010 B2
(45) Date of Patent: Jul. 15, 2025

(54) MASK ASSEMBLY AND METHOD FOR MANUFACTURING THE SAME

(71) Applicant: Samsung Display Co., Ltd., Yongin-si (KR)

(72) Inventors: Jeongkuk Kim, Suwon-si (KR); Hwi Kim, Suwon-si (KR); Youngmin Moon, Yongin-si (KR); Seungyong Song, Suwon-si (KR); Areum Lee, Suwon-si (KR); Eunbee Jo, Hwaseong-si (KR); Kyu Hwan Hwang, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 491 days.

(21) Appl. No.: 17/949,346

(22) Filed: Sep. 21, 2022

(65) Prior Publication Data

US 2023/0154941 A1    May 18, 2023

(30) Foreign Application Priority Data

Nov. 16, 2021    (KR) ........................ 10-2021-0157182

(51) Int. Cl.
| | |
|---|---|
| *H10D 86/01* | (2025.01) |
| *H10K 71/16* | (2023.01) |
| *H10K 71/20* | (2023.01) |
| *C23C 14/04* | (2006.01) |
| *C25D 1/10* | (2006.01) |

(52) U.S. Cl.
CPC ....... *H10D 86/0231* (2025.01); *H10K 71/166* (2023.02); *H10K 71/20* (2023.02); *C23C 14/042* (2013.01); *C25D 1/10* (2013.01)

(58) Field of Classification Search
CPC .. H10D 86/0231; H10K 71/166; H10K 71/20; C23C 14/042; C25D 1/10
See application file for complete search history.

(56) References Cited

U.S. PATENT DOCUMENTS

| | | | |
|---|---|---|---|
| 10,883,165 B2 | 1/2021 | Kim et al. | |
| 2016/0079568 A1* | 3/2016 | Han | C23C 18/31 |
| | | | 438/34 |
| 2017/0309868 A1* | 10/2017 | Ahn | C23C 14/24 |
| 2020/0208284 A1* | 7/2020 | Kim | C23C 28/02 |

FOREIGN PATENT DOCUMENTS

| | | |
|---|---|---|
| KR | 10-1918551 | 2/2019 |
| KR | 10-2019-0068675 | 6/2019 |
| KR | 10-1986333 | 6/2019 |
| KR | 10-1999360 | 7/2019 |
| KR | 10-2000548 | 7/2019 |
| KR | 10-2123552 | 6/2020 |
| KR | 10-2021-0091103 | 7/2021 |

* cited by examiner

*Primary Examiner* — Jeff W Natalini
*Assistant Examiner* — Brandon C Fox
(74) *Attorney, Agent, or Firm* — KILE PARK REED & HOUTTEMAN PLLC (57) ABSTRACT

A mask assembly includes a frame including a frame opening, and a mask disposed on the frame. The mask includes a body portion including an upper surface and a lower surface opposing each other and deposition openings spaced apart from each other, protrusions protruding from the upper surface and surrounding the corresponding deposition openings, and at least one step formation pattern overlapping the protrusions in a plan view and disposed in the body portion.

20 Claims, 10 Drawing Sheets

MASK ASSEMBLY AND METHOD FOR MANUFACTURING THE SAME

CROSS-REFERENCE TO RELATED APPLICATIONS

This U.S. non-provisional patent application claims priority to and benefits of Korean Patent Application No. 10-2021-0157182 under 35 U.S.C. § 119, filed on Nov. 16, 2021, in the Korean Intellectual Property Office (KIPO), the entire contents of which are incorporated herein by reference.

BACKGROUND

The disclosure herein relates to a mask assembly and a method for manufacturing the same, and more specifically, to a mask assembly including a mask manufactured through electroforming, and a method for manufacturing the same.

A display panel includes pixels. The pixels each include a driving element such as a transistor, and a display element such as an organic light-emitting element. The display element may be formed by stacking an electrode and various functional layers on a substrate.

The functional layers forming (or constituting) the display element are provided by being patterned using a mask having open regions defined to pass through the functional layers. In this case, the shapes of the patterned functional layers may be controlled depending on the shapes of the open regions in the mask. Accordingly, to improve the deposition quality of the patterned functional layers, it is necessary to develop technologies for a mask in which open regions are processed with high precision, and for a method for manufacturing the same.

SUMMARY

The disclosure provides a mask assembly including a mask for improving deposition quality of functional layers formed on a target substrate, and a method for manufacturing the same.

An embodiment of the disclosure provides a mask assembly including a frame including a frame opening, and a mask disposed on the frame and including a body portion including an upper surface and a lower surface opposing each other and deposition openings spaced apart from each other, protrusions protruding from the upper surface and surrounding the corresponding deposition opening, and at least one step formation pattern overlapping the protrusions in a plan view and disposed in the body portion.

In an embodiment, an inner surface defining each of the deposition openings, of the body portion may be inclined at an angle between the upper surface and the lower surface.

In an embodiment, one of an angle between the upper surface and the inner surface, and an angle between the lower surface and the inner surface may be is in a range of about 30° to about 70°.

In an embodiment, the at least one step formation pattern may include one of CuW, AlSiC, and invar.

In an embodiment, the at least one step formation pattern overlapping one of the protrusions in a plan view may include a plurality of step formation patterns.

In an embodiment, a shape of each of the at least one step formation patterns may be one of a circle, an ellipse, and a polygon.

In an embodiment, an upper surface of each of the protrusions may have a shape similar to the shape of each of the at least one step formation pattern.

In an embodiment, the frame and the mask may include invar.

In an embodiment, the frame and the mask may have a thermal expansion coefficient of about 6 ppm/° C. or less.

In an embodiment, the mask may have a crystal structure of BCC, or a crystal structure in which BCC and FCC are mixed.

In an embodiment, the body portion may have a thickness in a range of about 20 μm to about 200 μm.

In an embodiment, the mask may be formed by electroforming.

In an embodiment of the disclosure, a method for manufacturing a mask includes disposing an insulating portion on a support substrate, primarily growing a plating film on the support substrate by a first electroforming process to form a primarily grown plating film, disposing an inclusion on an upper surface of the primarily grown plating film to surround the insulating portion, secondarily growing the primarily grown plating film to cover the inclusion by a second electroforming process to form a secondarily grown plating film, forming a deposition opening by removing the insulating portion from the secondarily grown plating film, and forming a mask by removing the support substrate, wherein a first region of an upper surface of the mask, overlapping the inclusion in a plan view has a greater thickness than a second region adjacent to the first region.

In an embodiment, the insulating portion may include a lower surface contacting the support substrate, an upper surface opposing the lower surface, and a side surface between the lower surface and the upper surface, and the second region may be thinner than the insulating portion.

In an embodiment, a first angle between the lower surface and the side surface may be one of an acute angle, a right angle, and an obtuse angle.

In an embodiment, the mask may include a lower surface contacting the support substrate, an upper surface opposing the lower surface, and an inner surface defining the deposition opening, and the first angle and a second angle between the upper surface and the inner surface may be equal to each other.

In an embodiment, the inclusion may include one of CuW, AlSiC, and invar.

In an embodiment, the plating film may include invar.

In an embodiment, the method may further include heat-treating the mask.

In an embodiment, the mask may have a thermal expansion coefficient of about 6 ppm/° C. or less.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

In this specification, when a component (or region, layer, portion, etc.) is referred to as "on", "connected", or "coupled" to another component, it means that it is placed/connected/coupled directly on the other component or a third component can be disposed between them.

The same reference numerals or symbols refer to the same elements. In addition, in the drawings, thicknesses, ratios, and dimensions of components may be exaggerated for effective description of technical content.

Terms such as first and second may be used to describe various components, but the components should not be limited by the terms. These terms are only used for the purpose of distinguishing one component from other components. For example, without departing from the scope of the disclosure, a first component may be referred to as a second component, and similarly, a second component may be referred to as a first component. Singular expressions include plural expressions unless the context clearly indicates otherwise.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

Terms such as "include" or "have" are intended to designate the presence of a feature, number, step, action, component, part, or combination thereof described in the specification, and it should be understood that it does not preclude the possibility of presence or addition of one or more other features, numbers, steps, operations, components, parts, or combinations thereof.

Unless otherwise defined or implied herein, all terms (including technical and scientific terms) used in this specification have the same meaning as commonly understood by one of ordinary skill in the art to which this disclosure belongs. In addition, terms such as terms defined in commonly used dictionaries should be interpreted as having a meaning consistent with the meaning having in the context of the related technology, and should not be interpreted as too ideal or too formal unless explicitly defined here.

Hereinafter, embodiments of the disclosure will be described with reference to the drawings.

Figure 1:
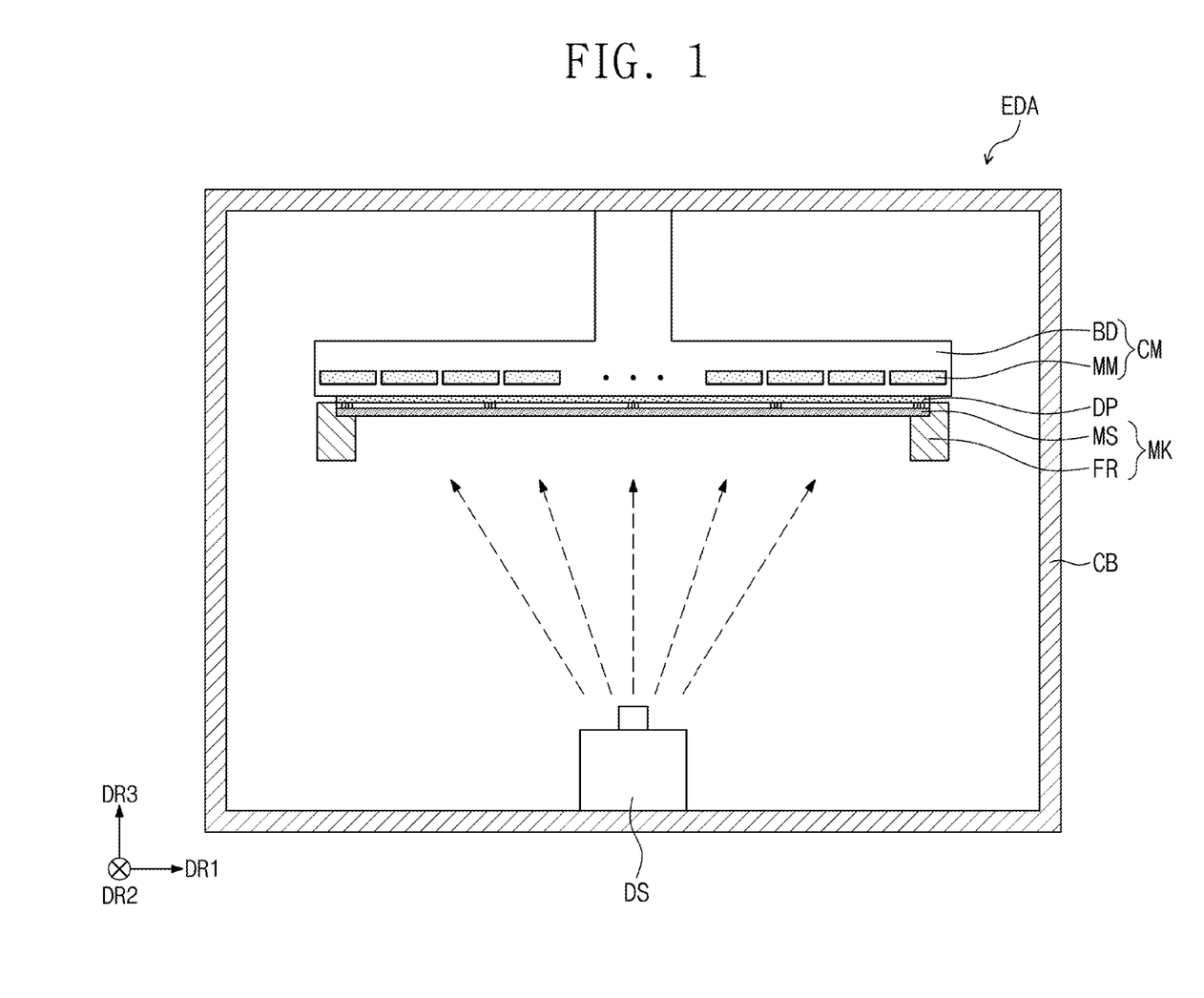
FIG. 1 is a schematic cross-sectional view of deposition equipment according to an embodiment of the disclosure.
Figure 2:
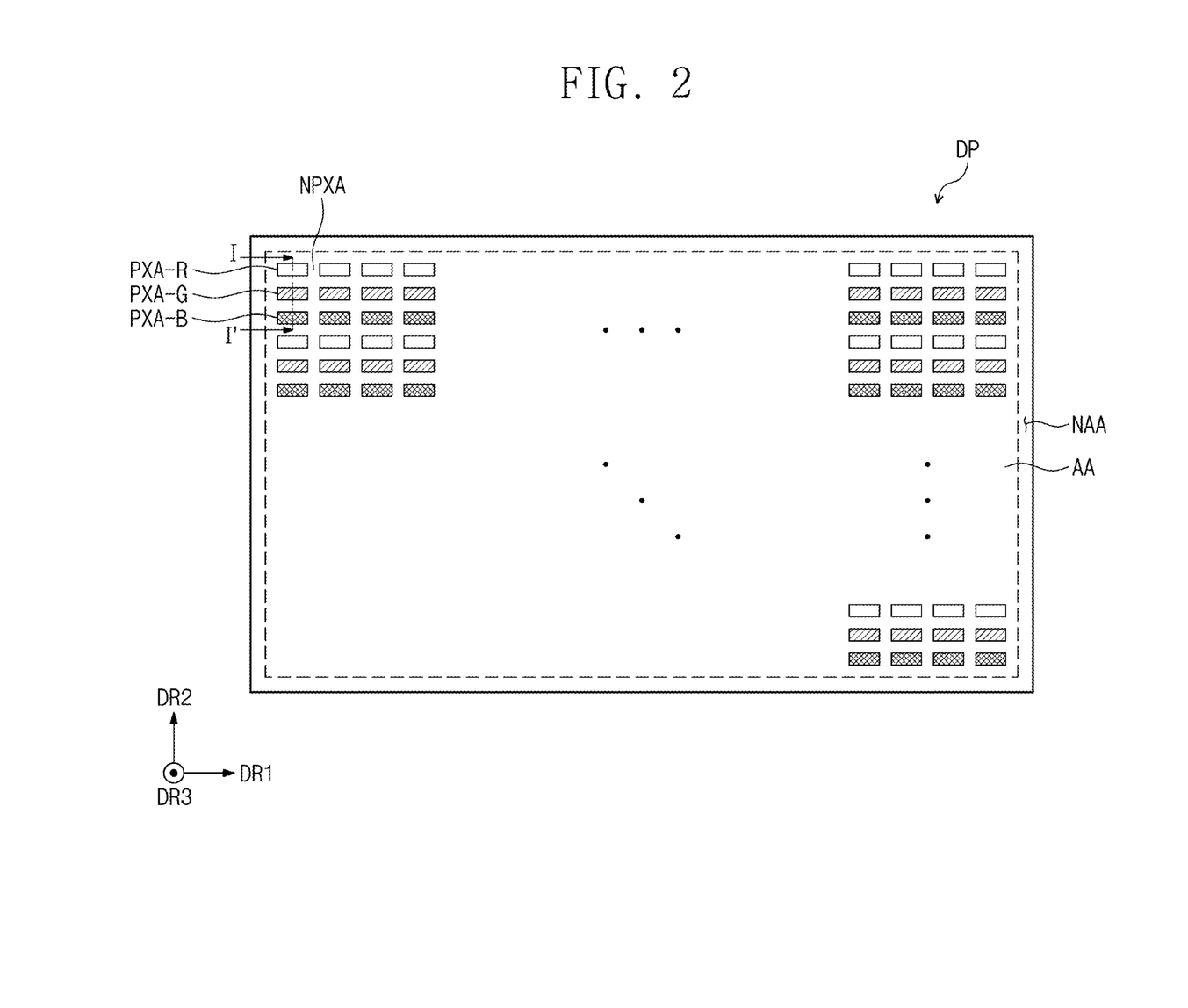
FIG. 2 is a schematic plan view of a display panel formed through deposition equipment according to an embodiment of the disclosure.
Figure 3:
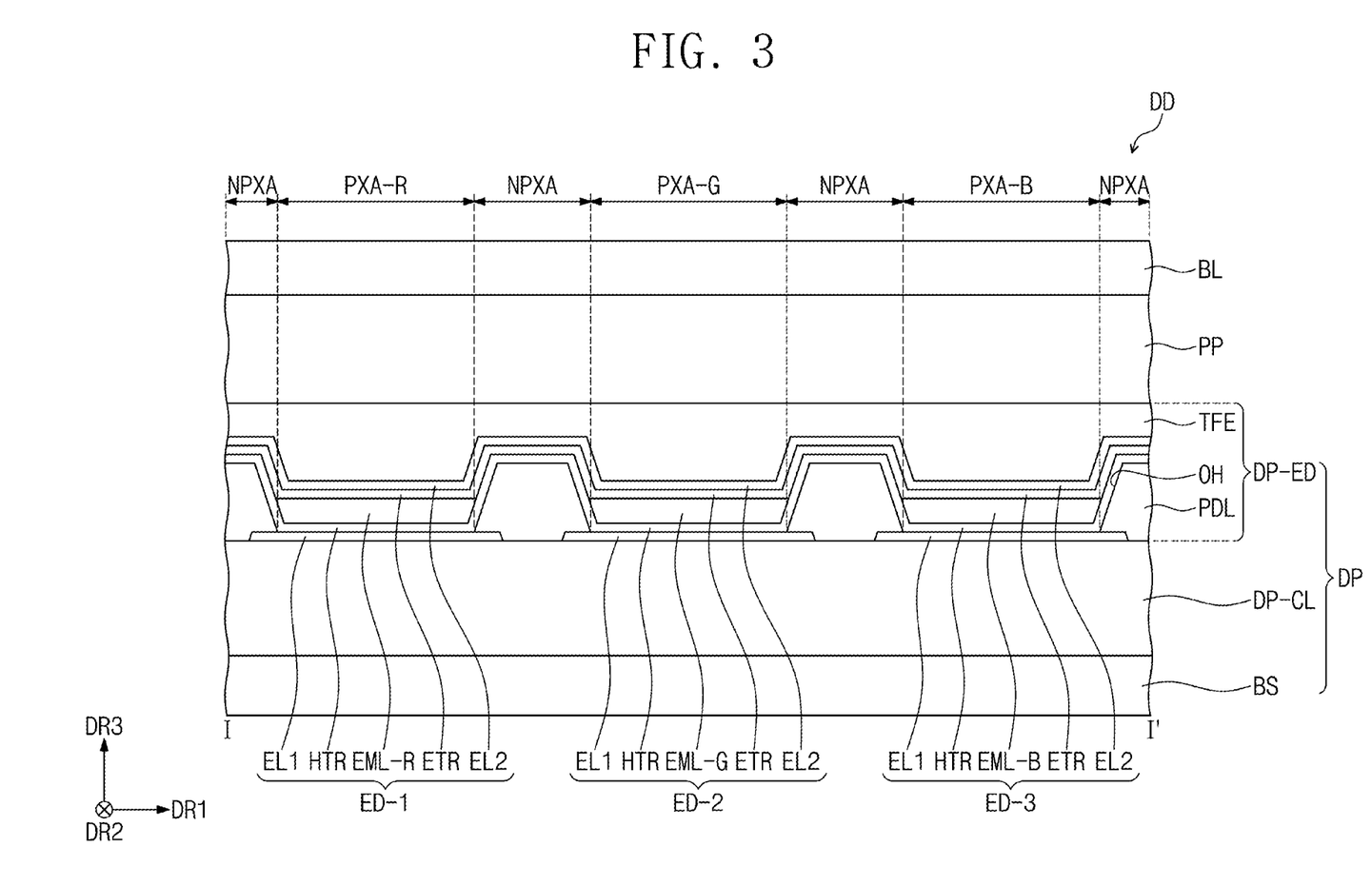
FIG. 3 is a schematic cross-sectional view taken along I-I' of FIG. 2.
Figure 4:
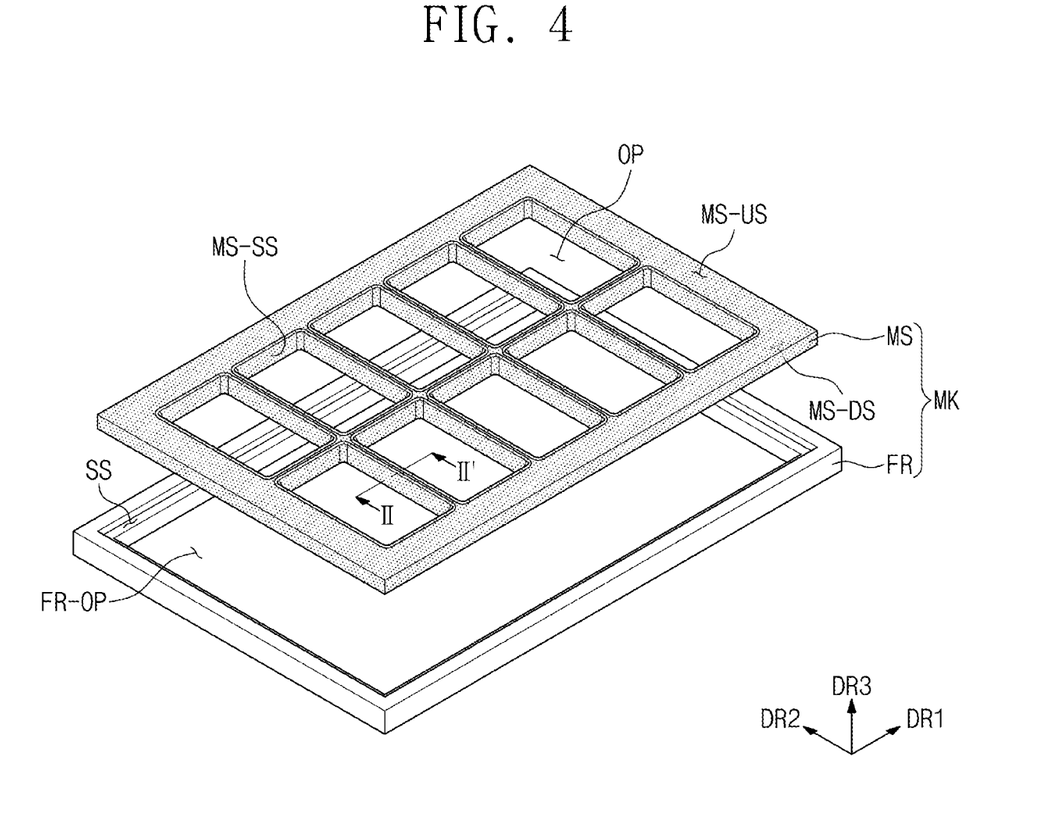
FIG. 4 is a schematic exploded perspective view of a mask assembly according to an embodiment of the disclosure.
Figure 5:
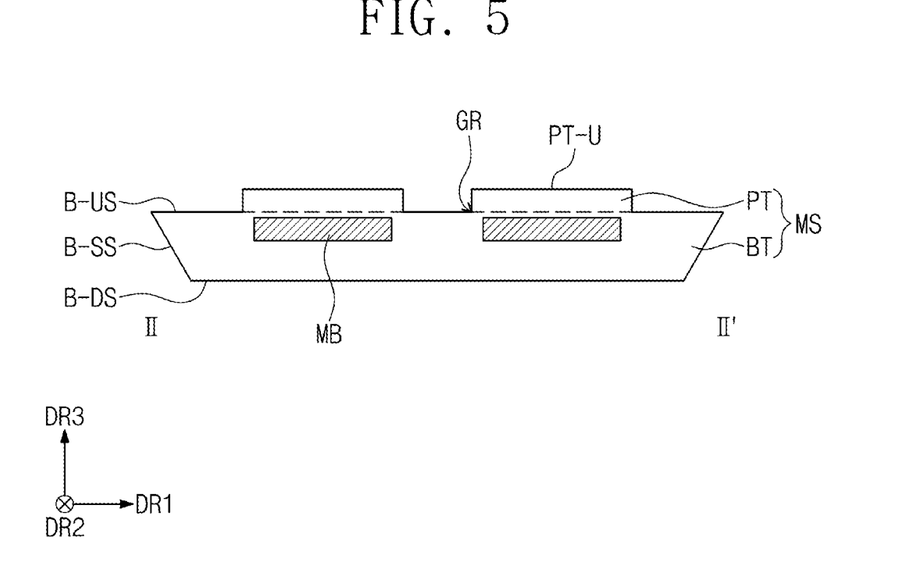
FIG. 5 is a schematic cross-sectional view taken along II-II' of FIG. 4.

FIG. 1 is a schematic cross-sectional view of deposition equipment according to an embodiment of the disclosure. FIG. 2 is a schematic plan view of a display panel formed by the deposition equipment according to an embodiment of the disclosure. FIG. 3 is a schematic cross-sectional view taken along I-I' of FIG. 2. FIG. 4 is a schematic exploded perspective view of a mask assembly according to an embodiment of the disclosure. FIG. 5 is a schematic cross-sectional view taken along II-II' of FIG. 4.

Referring to FIG. 1, deposition equipment EDA according to an embodiment of the disclosure includes a deposition chamber CB, a fixing member CM, a deposition source DS disposed in the deposition chamber CB, and a mask assembly MK disposed in the deposition chamber CB. Although not separately illustrated, the deposition equipment EDA may further include an additional mechanical device for implementing an inline system.

The deposition chamber CB may set a deposition condition to a vacuum condition. The deposition chamber CB may include a bottom surface, a ceiling surface, and sidewalls. The bottom surface of the deposition chamber CB is parallel to a plane defined by a first direction DR1 and a second direction DR2. A direction normal to the bottom surface of the deposition chamber CB is indicated by a third direction DR3.

The fixing member CM is disposed in the deposition chamber CB and above the deposition source DS, and fixes the mask assembly MK. The fixing member CM may be installed on the ceiling surface of the deposition chamber CB. The fixing member CM may include a jig or a robot arm that holds the mask assembly MK.

The fixing member CM includes a support part BD and magnetic bodies MM bonded to the support part BD. The support part BD may include a plate as a basic structure for fixing the mask assembly MK, but an embodiment of the disclosure is not limited thereto. The magnetic bodies MM may be disposed inside or outside the support part BD. The magnetic bodies MM may fix the mask assembly MK with a magnetic force.

The deposition source DS may evaporate a deposition material, and may thus eject the evaporated deposition material as a deposition vapor. The deposition vapor passes through the mask assembly MK, and is deposited onto a display panel DP in a pattern. The display panel DP may be defined as an intermediate substrate for manufacturing a finished display panel DP to be described below.

The mask assembly MK is disposed in the deposition chamber CB and above the deposition source DS, and supports the display panel DP. The display panel DP may include a glass substrate or a plastic substrate. The display panel DP may include a polymer layer disposed on a base substrate.

FIG. 2 illustrates a schematic plan view of a display panel DP manufactured by the deposition equipment EDA (see FIG. 1) according to the disclosure. Display panels DP may be disposed on the mask assembly MK illustrated in FIG. 1, and a deposition process may be performed.

Referring to FIG. 2, the display panel DP according to an embodiment may include an active region AA and a peripheral region NAA. The display panel DP may include a first light-emitting region PXA-R, a second light-emitting region PXA-G, and a third light-emitting region PXA-B which are separated from each other in the active region AA. For example, the first light-emitting region PXA-R may be a red light-emitting region that emits red light, the second light-emitting region PXA-G may be a green light-emitting region that emits green light, and the third light-emitting region PXA-B may be a blue light-emitting region that emits blue light.

When viewed in a plane defined by the first direction DR1 and the second direction DR2, the first to third light-emitting regions PXA-R, PXA-G, and PXA-B may not overlap each other (e.g., in a plan view) and be separated, and a non-light-emitting region NPXA may be defined between adjacent light-emitting regions PXA-R, PXA-G, and PXA-B.

The display panel DP illustrated in FIGS. 1 and 2 may include at least one functional layer manufactured using a mask MS. For example, among functional layers included in the display panel DP, a functional layer provided as "a common layer" so as to overlap the entirety of the light-emitting regions PXA-R, PXA-G, and PXA-B may be provided using the mask MS according to the disclosure.

The light-emitting regions PXA-R, PXA-G, and PXA-B of the display panel DP according to an embodiment may be arranged in a stripe form. For example, first light-emitting regions PXA-R, second light-emitting regions PXA-G, and third light-emitting regions PXA-B may be each alternately arranged in the first direction DR1, and light-emitting regions, which supply light of a same color, may be arranged spaced apart in the second direction DR2.

The arrangement form of the light-emitting regions PXA-R, PXA-G, and PXA-B is not limited thereto, and the arrangement sequence of the first light-emitting region PXA-R, the second light-emitting region PXA-G, and the third light-emitting region PXA-B may be provided in various combinations depending on the display quality characteristics required for the display panel DP.

For example, the light-emitting regions PXA-R, PXA-G, and PXA-B may have a PENTILE® structure having a diamond arrangement form. The areas of the light-emitting regions PXA-R, PXA-G, and PXA-B may be also different from each other, and the arrangement form and area provided herein may be variously adjusted or modified according to the display quality characteristics.

Referring to FIG. 3, a display panel DP formed by the deposition equipment EDA (see FIG. 1) according to the disclosure may be coupled to an optical layer PP disposed on the display panel DP and a cover substrate BL to constitute a display device DD. The display panel DP may include light-emitting elements ED-1, ED-2, and ED-3. The optical layer PP may be disposed on the display panel DP to control reflection of external light by the display panel DP. The optical layer PP may include, for example, a polarization layer or a color filter layer. Unlike what is illustrated in the drawing, the optical layer PP may be omitted from the display device DD according to an embodiment.

The cover substrate BL may be disposed on the optical layer PP. The cover substrate BL may be a member providing a base surface on which the optical layer PP is disposed. The cover substrate BL may be an inorganic layer, an organic layer, or a composite layer. Unlike what is illustrated, the cover substrate BL may be omitted in an embodiment.

In an embodiment, the display panel DP may include a base layer BS, a circuit layer DP-CL provided on the base layer BS, and a display element layer DP-ED. The display element layer DP-ED may include light-emitting elements ED-1, ED-2, and ED-3. The display panel DP may include an encapsulation layer TFE disposed on the display element layer DP-ED.

The display panel DP according to an embodiment may be an organic electroluminescence display panel including an organic electroluminescent element in the display element layer DP-ED. For example, the mask MS (see FIG. 1) according to the disclosure may be used, in case that a part of a functional layer of the display element layer DP-ED of the organic electroluminescence display panel is formed.

In an embodiment, the circuit layer DP-CL may be disposed on the base layer BS, and may include transistors (not shown). The transistors (not shown) may each include a control electrode, an input electrode, and an output electrode. The circuit layer DP-CL may include insulating layers.

The encapsulation layer TFE may cover the light-emitting elements ED-1, ED-2, and ED-3. The encapsulation layer TFE may encapsulate the display element layer DP-ED. The encapsulation layer TFE may be a thin-film encapsulation layer.

The light-emitting elements ED-1, ED-2, and ED-3 may respectively include a first electrode EL1 a hole transport region HTR, light-emitting layers EML-R, EML-G, and EML-B, an electron transport region ETR, and a second electrode EL2.

At least a part of the first electrode EL1 of each of the light-emitting elements ED-1, ED-2, and ED-3 may be exposed through a display opening OH defined in a pixel-defining film PDL. The light-emitting layers EML-R, EML-G, and EML-B may be disposed in the display opening OH, and the hole transport region HTR, the electron transport region ETR, and the second electrode EL2 may be provided as common layers throughout the light-emitting elements ED-1, ED-2, and ED-3.

At least one of the hole transport region HTR, the electron transport region ETR, or the second electrode EL2 provided as common layers in the light-emitting elements ED-1, ED-2, and ED-3 of the display panel DP may be provided using the mask MS according to the disclosure.

A part of the insulating layers included in the circuit layer DP-CL, or the encapsulation layer TFE disposed on the light-emitting elements ED-1, ED-2, and ED-3 may be provided using the mask MS according to the disclosure.

FIG. 4 is a schematic exploded perspective view of a mask assembly MK, and FIG. 5 is a schematic cross-sectional view taken along II-II' of FIG. 4.

Referring to FIG. 4, the mask assembly MK may include a mask MS and a frame FR. The mask assembly MK according to an embodiment may be used for forming a common layer containing a same material in a display panel DP including a to-be-deposited surface. The mask assembly MK according to an embodiment may correspond to an open mask for a thin-film process used for forming a functional layer provided as a thin-film. The open mask for a thin-film process may be a mask used for stacking, on a target substrate, thin-film layers having a same material throughout an individual display device.

The frame FR may support the mask MS. The frame FR may include a frame opening FR-OP therein. The frame opening FR-OP may be defined by side surfaces SS of the frame FR.

The frame FR may support an edge part of the mask MS. The mask MS may be seated on the side surfaces SS of the frame FR. The mask MS may be seated on the side surfaces SS of the frame FR, and may be bonded to the frame FR by a welding process.

The frame FR may be formed of a metal material including at least one of iron (Fe) or nickel (Ni). For example, the frame FR may include invar which is an alloy of iron and nickel. The frame FR may be manufactured including stainless steel (SUS).

The mask MS may include at least one deposition opening OP. The deposition opening OP may be formed passing through an upper surface MS-US of the mask MS and a lower surface MS-DS facing the upper surface MS-US. The deposition opening OP may be defined by an inner surface MS-SS disposed between the upper surface MS-US and the lower surface MS-DS. In a deposition process, a to-be-deposited surface of the display panel DP (see FIG. 1) may be disposed on the upper surface MS-US of the mask MS. Accordingly, the lower surface MS-DS may be a surface adjacent to the frame FR.

Deposition openings OP may be provided in a mask MS. The deposition openings OP may be arranged in the first direction DR1 and the second direction DR2. FIG. 4 illustrates the deposition openings OP having a 5×2 array. A display panel DP described in FIG. 2 may be disposed over a deposition opening OP. Accordingly, in case that the number of the deposition openings OP is 10, a deposition process may be performed in a state in which 10 display panels DP are disposed on the mask assembly MK. However, this is illustrated as an example, and the arrangement form of the deposition openings OP included on the mask MS is not limited thereto.

The mask MS may be formed of a metal material including at least one of iron (Fe) or nickel (Ni). For example, the mask MS may include invar which is an alloy of iron and nickel. The mask MS may be manufactured including stainless steel (SUS). The mask MS according to the disclosure and the frame FR may be formed of a same material.

In the disclosure, the frame FR and the mask MS may have a thermal expansion coefficient of about 6 ppm/° C. or less. The frame FR may also have a thermal expansion coefficient similar to that of the mask MS. Accordingly, it is possible to improve the deposition quality on a target substrate by minimizing the thermal deformation of the mask MS.

Referring to FIG. 5, a mask MS according to the disclosure may include a body portion BT, protrusions PT, and a step formation pattern MB (inclusion). The body portion BT and the protrusions PT correspond to a single pattern forming the mask MS, but will be separately described for convenience of explanation.

The body portion BT may be disposed, in common, throughout the mask MS. The body portion BT may include an upper surface B-US adjacent to a display panel DP, a lower surface B-DS facing the upper surface B-US, and a side surface B-SS disposed between the upper surface B-US and the lower surface B-DS.

In the embodiment, the side surface B-SS may be inclined at an angle (e.g., a predetermined or selected angle) from the upper surface B-US toward the lower surface B-DS. For example, the angle between the upper surface B-US and the side surface B-SS may be an acute angle. In the embodiment, since the angle between the upper surface B-US and the side surface B-SS is an acute angle, a shadow region occurring in a deposition process may be reduced.

The protrusions PT may protrude by a thickness (e.g., a predetermined or selected thickness) from the upper surface B-US of the body portion BT in the third direction DR3. Protrusions PT may be provided on the body portion BT. The protrusions PT may each surround at least a part of a corresponding deposition opening OP of the deposition openings OP (see FIG. 4).

FIG. 5 illustrates the protrusions PT disposed between adjacent deposition openings OP. A groove GR may be defined between the protrusions PT, but an embodiment of the disclosure is not limited thereto. A protrusion PT may be disposed between adjacent deposition openings OP, and the groove GR may be omitted. However, an embodiment of the disclosure is not limited to any one described above.

The step formation pattern MB may be disposed in the body portion BT. The step formation pattern MB may be provided embedded in the body portion BT, as a plating film is additionally grown after the step formation pattern MB (inclusion) is disposed during a process of growing the plating film to be described below.

The step formation patterns MB may respectively overlap the protrusions PT. For example, the protrusions PT may protrude from the upper surface B-US of the body portion BT due to the thickness of the step formation pattern MB disposed in the body portion BT. Accordingly, an upper surface PT-U of each of the protrusions PT may have a shape similar to that of the step formation pattern MB.

In the embodiment, since the step formation pattern MB has a rectangular shape having long sides extending in the first direction DR1 and short sides extending in the second direction DR2 in a cross-sectional view, each of the protrusions PT may also have a rectangular shape similar thereto, and may protrude from the upper surface B-US of the body portion BT.

The step formation pattern MB may include one of CuW, AlSiC, and invar. The arrangement form of the step formation pattern MB is not limited to any one as long as the step formation pattern MB surrounds at least a part of the corresponding deposition opening OP. For example, the step formation patterns MB (inclusion) may surround the deposition opening OP while being spaced apart from each other in the form of a metal ball, or may surround at least a part of the deposition opening OP as an extended pattern.

The upper surface MS-US of the mask MS may include the upper surface B-US of the body portion BT and the upper surface PT-U of each of the protrusions PT. The upper surface MS-US of the mask MS on which the display panel DP is substantially disposed in a deposition process may be the upper surface PT-U of each of the protrusions PT.

According to the disclosure, the display panel DP may be disposed on the upper surface PT-U of each of the protrusions PT protruding more than the upper surface B-US of the body portion BT, thereby reducing a defect that the display panel DP is torn while detaching/attaching the display panel DP from/to the mask assembly MK. Accordingly, the display panel DP with improved quality may be provided.

The mask MS according to the disclosure may be formed by electroforming. For example, a plating film is primarily grown by a first electroforming process, the step formation pattern MB (inclusion) may be disposed on the primarily grown plating film, and the plating film may be secondarily grown by a second electroforming process, thereby forming the mask MS in a state in which the step formation pattern MB is disposed inside the plating film. Here, the protrusions PT may protrude by a thickness due to the thickness of the step formation pattern MB. Detailed description will be made through a method for manufacturing a mask of FIGS. 9A to 9E.

Figure 6:
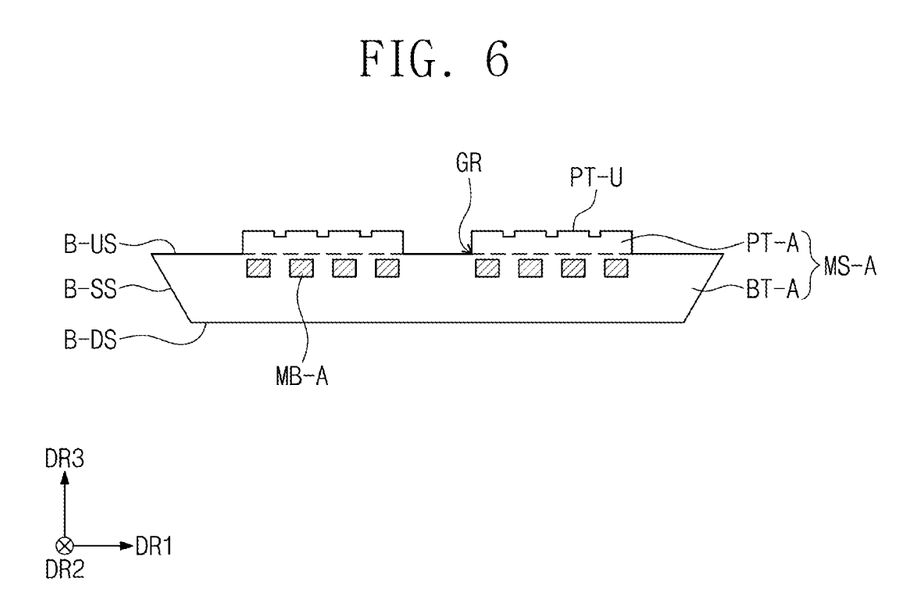
FIG. 6 is a schematic cross-sectional view of a mask according to an embodiment of the disclosure.
Figure 7:
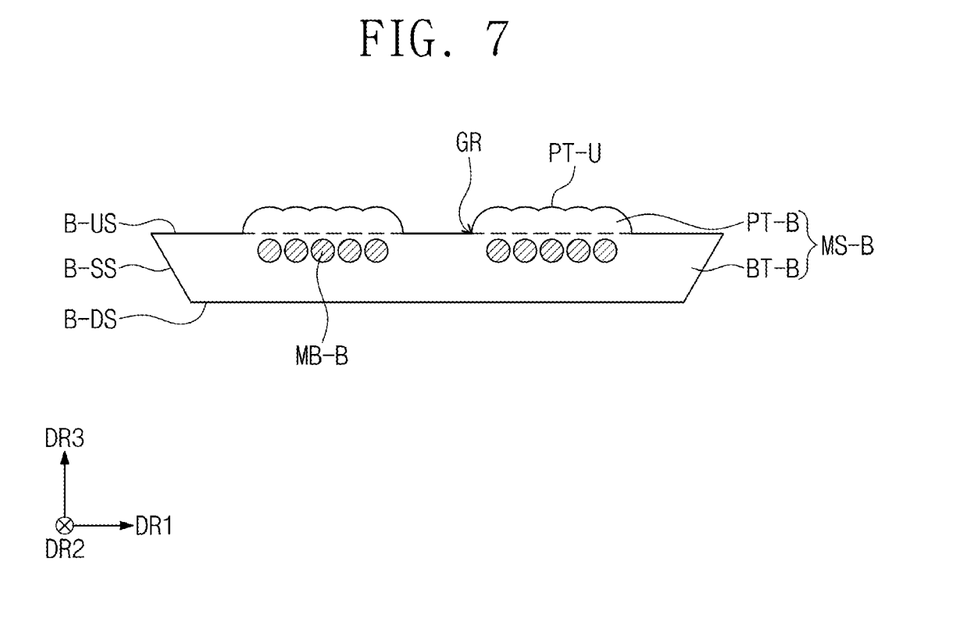
FIG. 7 is a schematic cross-sectional view of a mask according to an embodiment of the disclosure.
Figure 8:
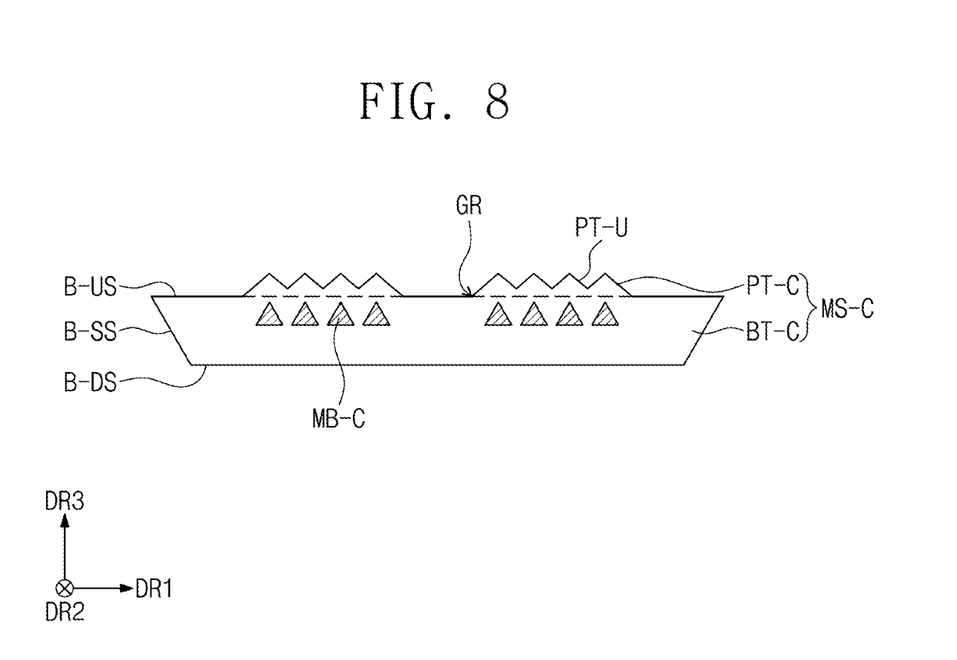
FIG. 8 is a schematic cross-sectional view of a mask according to an embodiment of the disclosure.

FIG. 6 is a schematic cross-sectional view of a mask according to an embodiment of the disclosure. FIG. 7 is a schematic cross-sectional view of a mask according to an embodiment of the disclosure. FIG. 8 is a schematic cross-sectional view of a mask according to an embodiment of the disclosure. The same/similar reference numerals or symbols are given to the same/similar components as those described in FIGS. 1 to 5, and duplicate description will be omitted. FIGS. 6 to 8 illustrate a region of a mask corresponding to a region taken along II-II' of FIG. 4.

Referring to FIG. 6, a mask MS-A according to an embodiment may include a body portion BT-A and protrusions PT-A.

The body portion BT-A may be disposed, in common, throughout the mask MS-A. The body portion BT-A may include an upper surface B-US adjacent to a display panel DP (see FIG. 1), a lower surface B-DS facing the upper surface B-US, and a side surface B-SS disposed between the upper surface B-US and the lower surface B-DS. The side surface B-SS may be inclined at an angle from the upper surface B-US toward the lower surface B-DS.

The protrusions PT-A may protrude by a thickness from the upper surface B-US of the body portion BT-A in the third direction DR3. Protrusions PT-A may be provided on the body portion BT-A. The protrusions PT-A may each surround at least a part of a corresponding deposition opening OP-A among the deposition openings OP (see FIG. 4).

Step formation patterns MB-A may be disposed in the body portion BT-A. The step formation patterns MB-A may respectively overlap the protrusions PT-A. For example, the protrusions PT-A may protrude from the upper surface B-US of the body portion BT-A due to the thickness of the step formation pattern MB-A disposed in the body portion BT-A. Accordingly, the upper surface PT-U of each of the protrusions PT-A may have a shape similar to that of the step formation pattern MB-A.

In the embodiment, the step formation pattern MB-A overlapping a protrusion PT-A may include patterns. The patterns may each have a rectangular shape in a cross-sectional view. Accordingly, the upper surface PT-U of each of the protrusions PT-A may be provided as an irregular surface.

Referring to FIG. 7, a mask MS-B according to an embodiment may include a body portion BT-B and protrusions PT-B.

The body portion BT-B may be disposed, in common, throughout the mask MS-B. The body portion BT-B may include an upper surface B-US adjacent to a display panel DP (see FIG. 1), a lower surface B-DS facing the upper surface B-US, and a side surface B-SS disposed between the upper surface B-US and the lower surface B-DS. The side surface B-SS may be inclined at an angle from the upper surface B-US toward the lower surface B-DS.

The protrusions PT-B may protrude by a thickness from the upper surface B-US of the body portion BT-B in the third direction DR3. Protrusions PT-B may be provided on the body portion BT-B. The protrusions PT-B may each surround at least a part of a corresponding deposition opening OP-B among the deposition openings OP (see FIG. 4).

Step formation patterns MB-B may be disposed in the body portion BT-B. The step formation patterns MB-B may respectively overlap the protrusions PT-B. For example, the protrusions PT-B may protrude from the upper surface B-US of the body portion BT-B due to the thickness of the step formation pattern MB-B disposed in the body portion BT-B. Accordingly, the upper surface PT-U of each of the protrusions PT-B may have a shape similar to that of the step formation pattern MB-B.

In the embodiment, the step formation pattern MB-B overlapping a protrusion PT-B may include patterns. The patterns may each have a circular shape in a cross-sectional view. Accordingly, the upper surface PT-U of each of the protrusions PT-B may be provided as a curved surface having a curvature (e.g., a predetermined or selected curvature). FIG. 7 illustrates circular patterns, but this is illustrated as an example, and the step formation pattern MB-B may include an elliptical pattern.

Referring to FIG. 8, a mask MS-C according to an embodiment may include a body portion BT-C and protrusions PT-C.

The body portion BT-C may be disposed, in common, throughout the mask MS-C. The body portion BT-C may include an upper surface B-US adjacent to a display panel DP (see FIG. 1), a lower surface B-DS facing the upper surface B-US, and a side surface B-SS disposed between the upper surface B-US and the lower surface B-DS. The side surface B-SS may be inclined at an angle from the upper surface B-US toward the lower surface B-DS.

The protrusions PT-C may protrude by a thickness from the upper surface B-US of the body portion BT-C in the third direction DR3. Protrusions PT-C may be provided on the body portion BT-C. The protrusions PT-C may each surround at least a part of a corresponding deposition opening OP-C among the deposition openings OP (see FIG. 4).

Step formation patterns MB-C may be disposed in the body portion BT-C. The step formation patterns MB-C may respectively overlap the protrusions PT-C. For example, the protrusions PT-C may protrude from the upper surface B-US of the body portion BT-C due to the thickness of the step formation pattern MB-C disposed in the body portion BT-C. Accordingly, the upper surface PT-U of each of the protrusions PT-C may have a shape similar to that of the step formation pattern MB-C.

In the embodiment, the step formation pattern MB-C overlapping a protrusion PT-C may include patterns. The patterns may each have a trigonal shape in a cross-sectional view. Accordingly, the upper surface PT-U of each of the protrusions PT-C may be provided as a protruding surface with an angled shape. FIG. 8 illustrates trigonal patterns, but this is illustrated as an example, and the step formation pattern MB-C may include a polygonal pattern.

FIGS. 9A to 9E are schematic cross-sectional views illustrating a method for manufacturing a mask according to an embodiment of the disclosure. The same/similar reference numerals or symbols are given to the same/similar components as those described in FIGS. 1 to 5, and duplicate description will be omitted. The method for manufacturing a mask according to the disclosure will be described through FIGS. 9A to 9E.

Figure 9A:
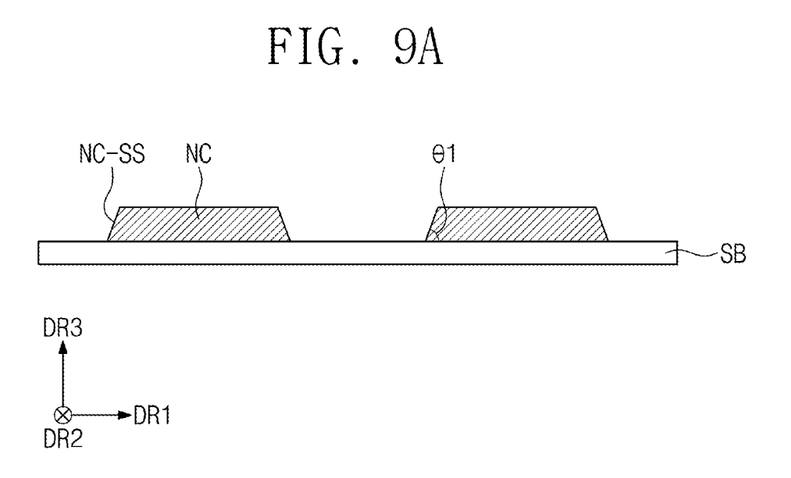
FIGS. 9A to 9E are schematic cross-sectional views illustrating a method for manufacturing a mask according to an embodiment of the disclosure.

Referring to FIG. 9A, the method for manufacturing a mask according to the disclosure may include disposing an insulating portion NC on a support substrate SB.

The support substrate SB may be provided as a base layer for growing plating during an electroforming process. A conductive support substrate SB may be used as a cathode body in the electroforming process. The support substrate SB may include stainless steel (SUS), but an embodiment of the disclosure is not limited thereto. The support substrate SB may include a monocrystalline or polycrystalline silicon material, but an embodiment of the disclosure is not limited thereto.

A region in which the insulating portion NC is disposed on the support substrate SB may be a region in which a plating film is not grown while performing the electroforming process. Accordingly, the insulating portion NC may have insulating characteristics. For example, the insulating portion NC may be removed from a mask MS during the final operation of a process for manufacturing a mask to be used as a structure for forming deposition openings OP (see FIG. 4) of the mask MS. Accordingly, insulating portions NC may be disposed on the support substrate SB depending on a required number of the deposition openings OP (see FIG. 4) in the mask MS.

In the embodiment, a first angle θ1 between a side surface NC-SS of the insulating portion NC and an upper surface of the support substrate SB may be an acute angle. Accordingly, in the embodiment, the insulating portion NC may have a reversely tapered shape.

The angle between a side surface B-SS and an upper surface B-US of the final mask MS (see FIG. 5) may be determined by the angle between the side surface NC-SS of the insulating portion NC and the upper surface of the support substrate SB. Detailed description will be made below.

Since the mask MS according to the disclosure is formed by the electroforming process, the insulating portion NC may include a non-conductive material having no reactivity during the electroforming process. For example, the insulating portion NC may include at least one of a polymer material (for example, a photoresist), silicon oxide, silicon nitride, or quartz.

The insulating portion NC may be formed on the support substrate SB by a process for depositing silicon oxide and silicon nitride, and also formed by a thermal oxidation or nitridation method using the support substrate SB as a base. The photoresist may also be formed using a printing method, etc.

Figure 9B:
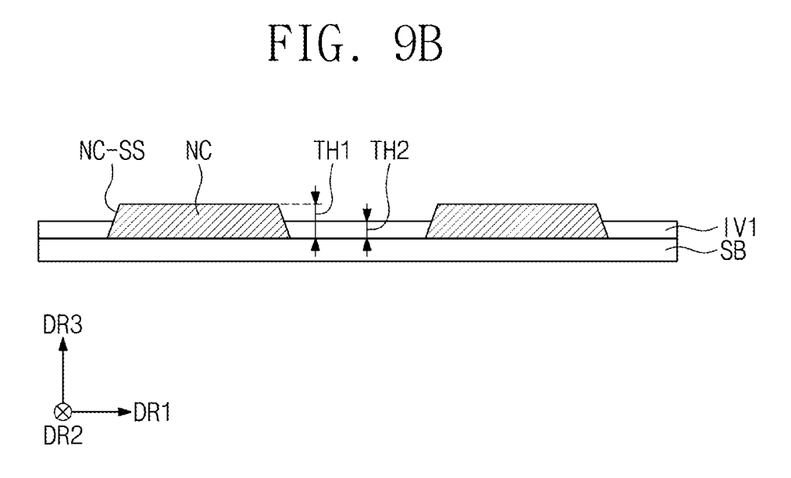

Referring to FIG. 9B, the method for manufacturing a mask according to the disclosure may include primarily growing a plating film on the support substrate SB by a first electroforming process.

A primarily grown plating film IV1 may be formed by immersing the support substrate SB in a plating solution in which an anode body opposite to the support substrate SB is immersed. The entirety or a part of the support substrate SB may be immersed.

The primarily grown plating film IV1 may be generated on the surface of the support substrate SB by electrodeposition due to the electric field formed between the support substrate SB and the anode body opposite to each other. In case that the primarily grown plating film IV1 is generated on the surface of the support substrate SB, the primarily grown plating film IV1 may not be generated in a region overlapping the insulating portion NC.

The plating solution may be an electrolyte and used as a material of the mask MS. In an embodiment, in case that the plating film IV1 is produced using invar which is an alloy of iron and nickel, a mixed solution of a solution containing nickel ions and a solution containing iron ions may be used as a plating solution. In an embodiment, in case that the plating film IV1 is produced using super invar which is an alloy of iron, nickel, and cobalt, a mixed solution of a solution containing nickel ions, a solution containing iron ions, and a solution containing cobalt ions may be used as a plating solution.

In the embodiment, the insulating portion NC having a first thickness TH1 and the primarily grown plating film IV1 having a second thickness TH2 smaller than the first thickness TH1 may be grown on the support substrate SB.

Since the insulating portion NC has insulating characteristics, an electric field is not formed between the insulating portion NC and the plating solution including the anode body, or only a weak electric field is formed to an extent that it is difficult to perform plating.

Figure 9C:
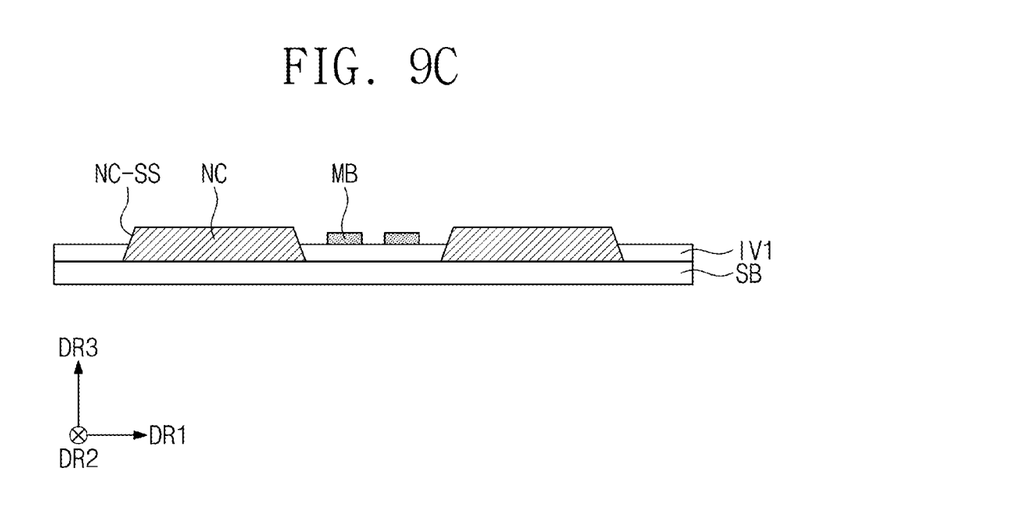

Referring to FIG. 9C, the method for manufacturing a mask according to the disclosure may include disposing an inclusion MB on the primarily grown plating film IV1.

The inclusion MB (step formation pattern) may be disposed on the upper surface of the primarily grown plating film IV1 so as to surround at least a part of the insulating portion NC. The inclusion MB may include any one among CuW, AlSiC, and invar.

The inclusion MB may include patterns. FIG. 9C illustrates, as an example, the inclusion MB having a rectangular shape, but the cross-sectional shape of the inclusion MB is not limited any one example. Inclusions MB may be provided between adjacent insulating portions NC, and may be disposed apart from each other.

Figure 9D:
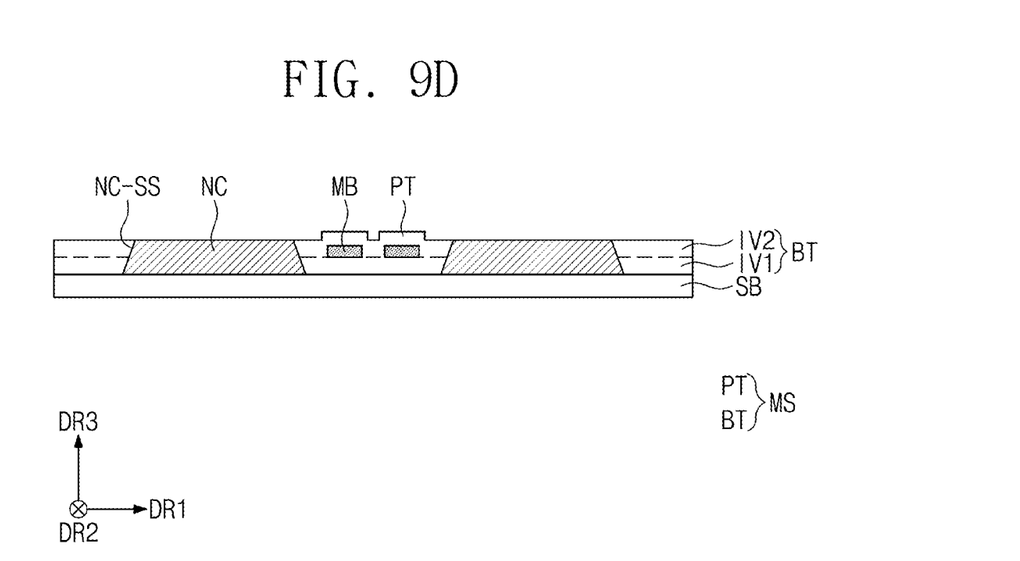

Referring to FIG. 9D, the method for manufacturing a mask according to the disclosure may include secondarily growing the primarily grown plating film IV1 by a second electroforming process.

A secondarily grown plating film IV2 may be grown on the support substrate SB so as to cover the inclusion MB. The secondarily grown plating film IV2 may have a protrusion PT due to the thickness of the inclusion MB. The protrusion PT may be a region in which a display panel DP (see FIG. 1) is directly disposed during a deposition process. Accordingly, a deposition process may be performed without any interference with the display panel DP on a region, other than the protrusions PT, of the secondarily grown plating film IV2.

FIG. 9D discriminately illustrates the boundary between the primarily grown plating film IV1 and the secondarily grown plating film IV2 with a dotted line, but this is for convenience of explanation, and the primarily grown plating film IV1 and the secondarily grown plating film IV2 may be provided as a single mask MS without the boundary.

Figure 9E:
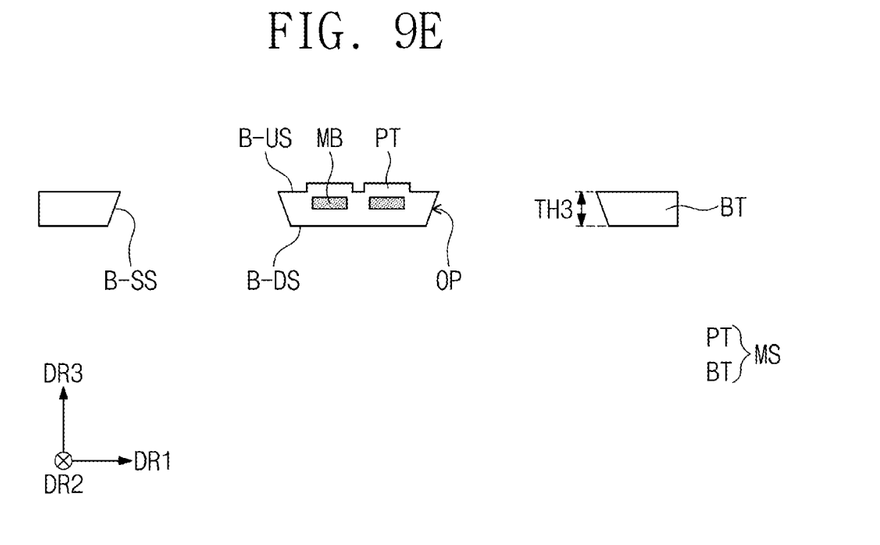

Referring to FIG. 9E, the method for manufacturing a mask according to the disclosure may include forming a deposition opening OP by removing the insulating portion NC from the secondarily grown plating film IV2. It will be described that the mask MS is divided into a body portion BT and a protrusions PT for convenience of explanation. The body portion BT may include an upper surface B-US, a lower surface B-DS, and a side surface B-SS.

A region in which the insulating portion NC is removed from the secondarily grown plating film IV2 may be formed as the deposition opening OP. Accordingly, the angle θ1 between the side surface NC-SS of the insulating portion NC and the upper surface of the support substrate SB may be the same as the angle between the upper surface B-US and the side surface B-SS of the body portion BT.

A third thickness TH3 of the body portion BT may be equal to or smaller than the first thickness TH1 of the insulating portion NC. The third thickness TH3 may be about 20 μm to about 200 μm.

The method for manufacturing a mask according to the disclosure may include removing the support substrate SB from the mask MS, after removing the insulating portion NC.

The method for manufacturing a mask according to the disclosure may further include performing a heat treatment. Generally, an invar sheet formed by electroforming has a thermal expansion coefficient greater than an invar sheet formed by rolling. Accordingly, an invar sheet may be subjected to a heat treatment, thereby having a lower thermal expansion coefficient, but a slight deformation may occur in the invar sheet during the heat treatment.

Accordingly, in case that the heat treatment is performed before removing the support substrate SB and the insulating portion NC from the mask MS, the insulating portion NC and the support substrate SB may maintain the shape of the mask MS to be undeformed. Therefore, the method according to the disclosure has the advantage capable of preventing minute deformation caused by the heat treatment. However, an embodiment of the disclosure is not limited thereto, and the heat treatment may be performed in a state in which one of the insulating portion NC and the support substrate SB is removed from the mask MS.

After the heat treatment is performed, the thermal expansion coefficient of the mask MS may be reduced to about 6 ppm/° C. or less.

The mask MS according to the disclosure may have a body-centered cubic (BCC) crystal structure, or a structure in which BCC and face-centered cubic (FCC) crystal structures are mixed, unlike an FCC crystal structure of an invar sheet formed by rolling.

The mask MS according to the disclosure is manufactured by the electroforming process, thereby improving the manufacturing precision of the mask MS. Since the deposition opening OP is formed using the insulating portion NC, the side surface of the mask MS may be controlled to have an angle and thickness as desired. Since the thermal expansion coefficient of the mask MS is reduced by the heat treatment, the mask MS with reduced thermal deformation during the deposition process may be provided.

Figure 10:
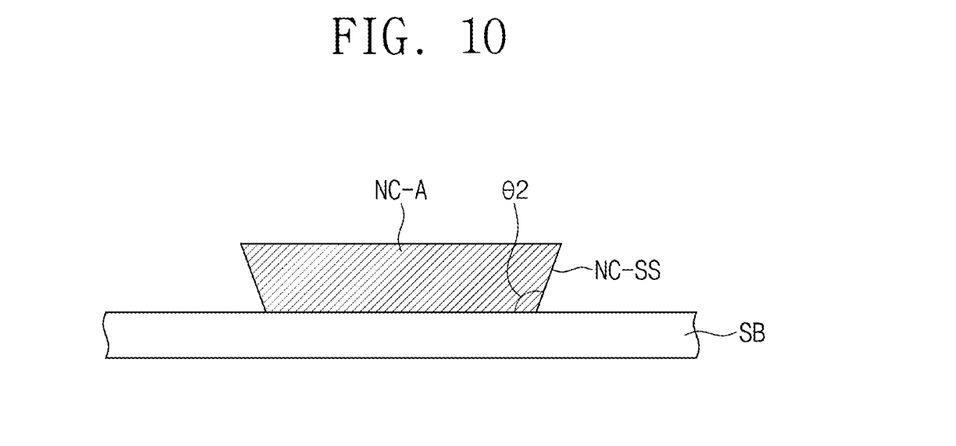
FIG. 10 is a schematic cross-sectional view of an insulating portion according to an embodiment of the disclosure.
Figure 11:
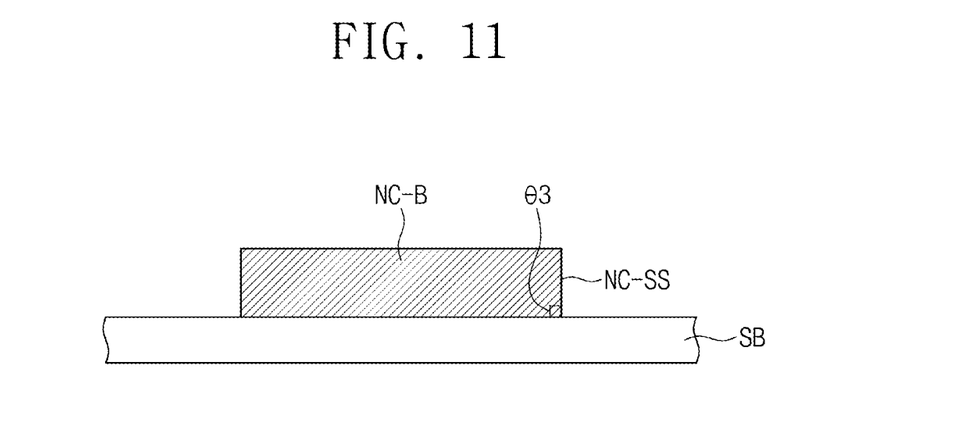
FIG. 11 is a schematic cross-sectional view of an insulating portion according to an embodiment of the disclosure.

FIG. 10 is a schematic cross-sectional view of an insulating portion according to an embodiment of the disclosure. FIG. 11 is a schematic cross-sectional view of the insulating portion according to an embodiment of the disclosure. The same/similar reference numerals or symbols are given to the same/similar components as those described in FIGS. 9A to 9E, and duplicate description will be omitted.

Referring to FIG. 10, a second angle θ2 between a side surface NC-SS of an insulating portion NC-A and the support substrate SB according to the embodiment may be an obtuse angle. Accordingly, according to the embodiment, the angle between the upper surface B-US and the side surface B-SS of the body portion BT described in FIG. 9E may be an obtuse angle.

Referring to FIG. 11, a third angle θ3 between the side surface NC-SS of an insulating portion NC-B and the support substrate SB according to the embodiment may be a right angle. Accordingly, according to the embodiment, the angle between the upper surface B-US and the side surface B-SS of the body portion BT described in FIG. 9E may be a right angle.

According to the disclosure, the angle between the inner surface MS-SS defining the deposition opening OP (see FIG. 4) and the upper surface MS-US or the lower surface MS-DS of the mask MS may be determined depending on the angle between the side surface of the insulating portion and the support substrate SB.

A mask according to the disclosure may be manufactured by an electroforming process, thereby improving the manufacturing precision of the mask. A deposition opening may be formed during the electroforming process, thereby controlling a side surface of the mask to have an angle and thickness as desired. The thermal expansion coefficient of the mask may be reduced by heat treatment, thereby providing the mask with reduced thermal deformation during a deposition process.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A mask assembly comprising:
a frame including a frame opening; and
a mask disposed on the frame and including:
 a body portion including:
  an upper surface and a lower surface opposing each other;
 deposition openings spaced apart from each other;
 protrusions protruding from the upper surface and surrounding the corresponding deposition opening; and
 at least one step formation pattern overlapping the protrusions in a plan view and disposed in the body portion.

2. The mask assembly of claim 1, wherein an inner surface defining each of the deposition openings, of the body portion is inclined at an angle between the upper surface and the lower surface.

3. The mask assembly of claim 2, wherein one of an angle between the upper surface and the inner surface, and an angle between the lower surface and the inner surface is in a range of about 30° to about 70°.

4. The mask assembly of claim 1, wherein the at least one step formation pattern comprises one of CuW, AlSiC, and invar.

5. The mask assembly of claim 1, wherein the at least one step formation pattern overlapping one of the protrusions in a plan view includes a plurality of step formation patterns.

6. The mask assembly of claim 5, wherein a shape of each of the at least one step formation patterns is one of a circle, an ellipse, and a polygon.

7. The mask assembly of claim 6, wherein an upper surface of each of the protrusions has a shape similar to the shape of each of the at least one step formation pattern.

8. The mask assembly of claim 1, wherein the frame and the mask comprise invar.

9. The mask assembly of claim 1, wherein the frame and the mask have a thermal expansion coefficient of about 6 ppm/° C. or less.

10. The mask assembly of claim 1, wherein the mask has a crystal structure of BCC, or a crystal structure in which BCC and FCC are mixed.

11. The mask assembly of claim 1, wherein the body portion has a thickness in a range of about 20 μm to about 200 μm.

12. The mask assembly of claim 1, wherein the mask is formed by electroforming.

13. A method for manufacturing a mask, the method comprising:
   disposing an insulating portion on a support substrate;
   primarily growing a plating film on the support substrate by a first electroforming process to form a primarily grown plating film;
   disposing an inclusion on an upper surface of the primarily grown plating film to surround the insulating portion;
   secondarily growing the primarily grown plating film to cover the inclusion by a second electroforming process to form a secondarily grown plating film;
   forming a deposition opening by removing the insulating portion from the secondarily grown plating film; and
   forming a mask by removing the support substrate,
   wherein a first region of an upper surface of the mask, overlapping the inclusion in a plan view has a greater thickness than a second region adjacent to the first region.

14. The method of claim 13, wherein
   the insulating portion comprises:
      a lower surface contacting the support substrate;
      an upper surface opposing the lower surface; and
      a side surface between the lower surface and the upper surface, and
   the second region is thinner than the insulating portion.

15. The method of claim 14, wherein a first angle between the lower surface and the side surface is one of an acute angle, a right angle, and an obtuse angle.

16. The method of claim 15, wherein
   the mask comprises:
      a lower surface contacting the support substrate;
      an upper surface opposing the lower surface; and
      an inner surface defining the deposition opening, and
   the first angle and a second angle between the upper surface and the inner surface are equal to each other.

17. The method of claim 13, wherein the inclusion comprises one of CuW, AlSiC, and invar.

18. The method of claim 13, wherein the plating film comprises invar.

19. The method of claim 13, further comprising:
   heat-treating the mask.

20. The method of claim 13, wherein the mask has a thermal expansion coefficient of about 6 ppm/° C. or less.

* * * * *